United States Patent
Mancosu et al.

(10) Patent No.: US 7,138,750 B2
(45) Date of Patent: Nov. 21, 2006

(54) PIEZOELECTRIC GENERATOR FOR SENSORS INSIDE VEHICLE TIRES

(75) Inventors: Federico Mancosu, Milan (IT); Giuseppe Matrascia, Seregno (IT); Diego Villa, Trecella (IT)

(73) Assignee: Pirelli Pneumatic S.p.A., Milan (IT)

( * ) Notice: Subject to any disclaimer, the term of this patent is extended or adjusted under 35 U.S.C. 154(b) by 0 days.

(21) Appl. No.: 11/292,240

(22) Filed: Dec. 2, 2005

(65) Prior Publication Data

US 2006/0082258 A1  Apr. 20, 2006

Related U.S. Application Data

(62) Division of application No. 10/257,215, filed as application No. PCT/EP01/04210 on Apr. 12, 2001, now Pat. No. 6,992,423.

(60) Provisional application No. 60/218,829, filed on Jul. 18, 2000.

(30) Foreign Application Priority Data

Apr. 18, 2000 (EP) .................................. 00830292

(51) Int. Cl.
H01l 41/113 (2006.01)
(52) U.S. Cl. .................................. 310/339; 310/319
(58) Field of Classification Search ............... 310/319, 310/339
See application file for complete search history.

(56) References Cited

U.S. PATENT DOCUMENTS

| 4,160,234 A | 7/1979 | Karbo et al. |
| 4,300,119 A | 11/1981 | Wiernicki |
| 4,504,761 A | 3/1985 | Triplett |
| 5,749,984 A | 5/1998 | Frey et al. |
| 6,204,756 B1 * | 3/2001 | Senyk et al. ................. 340/438 |
| 6,438,193 B1 | 8/2002 | Ko et al. |
| 6,486,776 B1 | 11/2002 | Pollack et al. |
| 6,637,276 B1 | 10/2003 | Adderton et al. |
| 6,658,928 B1 | 12/2003 | Pollack et al. |
| 6,662,642 B1 | 12/2003 | Breed et al. |
| 6,666,080 B1 | 12/2003 | Buist et al. |
| 6,992,423 B1 * | 1/2006 | Mancosu et al. ........... 310/339 |
| 7,047,800 B1 * | 5/2006 | Thiesen et al. ............... 73/146 |
| 2004/0100100 A1 * | 5/2004 | Wilson ...................... 290/1 R |
| 2005/0285569 A1 * | 12/2005 | Rao et al. ................... 320/128 |
| 2005/0285728 A1 * | 12/2005 | Tyndall ...................... 340/447 |
| 2006/0006991 A1 * | 1/2006 | Tyndall et al. ............. 340/442 |
| 2006/0022555 A1 * | 2/2006 | Balasubramaniam et al. .... 310/339 |
| 2006/0130589 A1 * | 6/2006 | Jackson et al. ............... 73/730 |

FOREIGN PATENT DOCUMENTS

| DE | 44 02 136 A1 | 7/1995 |
| DE | 195 32 914 A1 | 3/1997 |
| FR | 2580997 A1 | 10/1986 |
| GB | 2307044 A | 5/1997 |
| JP | 07-276914 A | 10/1995 |
| JP | 09-237398 A | 9/1997 |

(Continued)

*Primary Examiner*—Thomas M. Dougherty
(74) *Attorney, Agent, or Firm*—Finnegan, Henderson, Farabow, Garrett & Dunner, L.L.P.

(57) ABSTRACT

A system for generating electrical energy in a tire for a vehicle includes at least one coaxial piezoelectric cable that generates electrical energy when deformed. The at least one coaxial piezoelectric cable is associated with the tire. And the at least one coaxial piezoelectric cable extends along at least a portion of the tire. A tire for a vehicle includes a carcass, a tread, and the at least one coaxial piezoelectric cable.

44 Claims, 3 Drawing Sheets

FOREIGN PATENT DOCUMENTS

| | | |
|---|---|---|
| JP | 10-305715 A | 11/1998 |
| JP | 10-324120 A | 12/1998 |
| JP | 2003-065871 A | 3/2003 |
| WO | WO 01/36241 A1 | 5/2001 |
| WO | WO 01/54955 A1 | 8/2001 |

* cited by examiner

PIEZOELECTRIC GENERATOR FOR SENSORS INSIDE VEHICLE TIRES

This application is a divisional application of U.S. patent application Ser. No. 10/257,215, filed Jan. 14, 2003, now U.S. Pat. No. 6,992,423, which is a national-stage entry under 35 U.S.C. § 371 from International Application No. PCT/EP01/04210, filed Apr. 12, 2001, in the European Patent Office, the contents of both which are relied upon and incorporated herein by reference; additionally, Applicants claim the right of priority under 35 U.S.C. § 119(a)–(d) based on patent application No. 00830292.9, filed Apr. 18, 2000, in the European Patent Office; further, Applicants claim the benefit under 35 U.S.C. § 119(e) based on prior-filed, copending provisional application No. 60/218,829, filed Jul. 18, 2000, in the U.S. Patent and Trademark Office.

The present invention relates to a system for generating and using electrical energy in a vehicle tyre and a tyre equipped with this system.

More specifically, the present invention relates to a system for generating electrical energy while a vehicle is in motion, this energy also being able to be stored for use in the said tyre even when the vehicle is stationary.

U.S. Pat. No. 4,504,761 discloses an electricity generating apparatus comprising a motor vehicle having an electrical system comprising a battery and a plurality of assemblies comprising a wheel and a tyre having a rubber envelope comprising a first annular band and a second annular band that has a plurality of projections positioned close to the first band so as to move towards it in response to rolling movements of the tyre; and means for generating electricity in response to movements of the motor vehicle along a road comprising a multiplicity of piezoelectric elements fixed to the first band and positioned close to the projections so as to engage with them during the rolling movement of the tyre in order to generate electricity in response to the rolling movement of the tyres with respect to the road; and means of interconnection of the piezoelectric elements in a circuit with the battery to supply electrical energy, generated by the piezoelectric elements, to the battery, the said means having output conductors.

The electricity generating system in that patent exhibits many disadvantages. The bands carrying the piezoelectric elements and the projections which activate them require the existence of a sort of chamber in the tyre. This requires a profound modification of the structure of the tyre and significantly increases the costs of manufacture. It also increases the weight of the tyre and thereby adversely affects its performance, such as rolling resistance and comfort.

In addition, the fitting of the various piezoelectric elements in their band and the formation of the inductive systems necessary to transmit the electrical energy produced to the battery of the motor vehicle are very complex and expensive.

It is also known that it has been proposed that various types of sensors be installed in the tyre, e.g. pressure, temperature, force, velocity sensors an the like, to monitor and control the performance of the tyre and/or of the vehicle. These systems however require an electrical power supply system for the operation of the sensor and/or of the transmitter which transfers out the data and information collected by the sensor.

The power supply systems proposed hitherto are essentially of two types.

The first type consists of inductive systems or sliding-contact systems such as that required in U.S. Pat. No. 4,504,761, except that the electrical energy is transferred from the vehicle battery to a sensor and/or transmitter located in the tyre. However, as we have already seen, these systems have the drawback of being very complicated and expensive.

The second type meanwhile consists of a cell mounted inside the tyre. However, even the most sophisticated and expensive cells eventually run down and replacing them with a new cell inside the tyre will be a nuisance and expensive for the user of the vehicle.

The industry is therefore still highly conscious of the need for a system able to power a sensor and/or a transmitter located inside a tyre of a vehicle wheel that will be simple, cheap and not inconvenience the user of the vehicle.

The inventors have now realized that this objective can be achieved by means of a piezoelectric element associated to a tyre without requiring any modification to the conventional tyre structure.

In its first aspect, the present invention relates to a system for generating electrical energy in a vehicle tyre comprising at least one piezoelectric element associated to the said tyre which generates electrical energy whenever it is deformed, the said tyre also comprising a carcass and a tread and being mounted on a vehicle wheel rim, characterized in that the said at least one piezoelectric element is elongate, extends along at least a portion of the said tyre and is-connected electrically to an electrical circuit that is applied to the said tyre and is not in electrical communication with the vehicle.

In its second aspect, the present invention relates to a tyre for a vehicle comprising at least one piezoelectric element that generates electrical energy whenever it is deformed, the said tyre also comprising a carcass and a tread and being characterized in that the said at least one piezoelectric element is elongate, extends along at least a portion of the said tyre and is connected electrically to an electrical circuit that is applied to the said tyre and is not in electrical communication with the vehicle.

In a first preferred embodiment, the said electrical circuit comprises a sensor for monitoring and controlling the performance of the tyre and/or of the vehicle.

Typically, the said sensor is selected from pressure, temperature, force, velocity sensors and the like.

In a second preferred embodiment, the said electrical circuit comprises a transmitter that transmits out of the tyre the data collected by the said sensor.

Preferably, the said transmitter is operationally connected to a receiver installed in the vehicle. In this way the data acquired by the sensors operating inside the tyre are processed by suitable devices installed on the vehicle in order to initiate actions designed to regulate/optimize the behaviour of the moving vehicle during cornering and/or when travelling in a straight line, as described in European Patent Applications No. 99830714.4 filed on 18 Nov. 1999, and No. 00830041.0 filed on 25 Jan. 2000, in the present Applicant's name.

Typically, the said transmitter is a radio transmitter.

In a third preferred embodiment, the said electrical circuit includes a device that stores the electrical energy produced by the said piezoelectric element.

Advantageously, the said storage device is a capacitor/rechargeable battery assembly that acts as a buffer battery.

The arrangement of the said elongate piezoelectric element and its length are not of critical importance. However, it is preferable to attach it to an inside surface of the said tyre carcass because fitting it here is very economical.

Still more preferably, the said elongate piezoelectric element is laid with an undulated path along the circumference of the tyre. This makes it possible to have a continuous output of power.

A typical example of an elongate piezoelectric element according to the invention is a coaxial piezoelectric cable comprising a central core of electrically conducting material, an electrically insulating layer made of a piezoelectric polymer, a braided conductor made of an electrically conducting material, and a sheath.

The said electrical circuit and its components are preferably also attached to an inside surface of the said carcass for the reasons already given on the subject of the said elongate piezoelectric element.

In the course of this description and the claims, the expression "elongate piezoelectric element" is used to indicate a piezoelectric element whose length is at least 2 times, preferably at least 3 times, and still more preferably at least 5 times greater than its width or diameter. The length of the said "elongate piezoelectric element" is preferably at least 30 mm because otherwise it does not have sufficient sensitivity to the deforming variations imposed on any portion of the tyre during its rotation.

The features and advantages of the invention will now be explained with reference to an embodiment shown by way of non-restrictive example in the accompanying figures, where:

Figure 1:
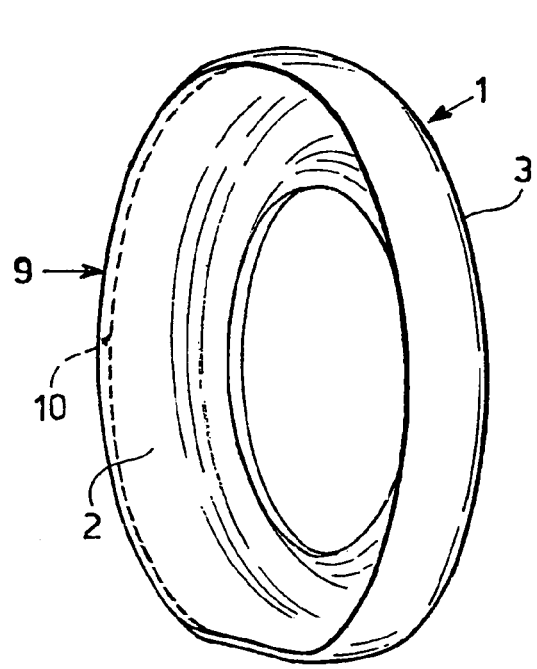
FIG. 1 shows a system for generating electrical energy comprising a piezoelectric element associated to a vehicle tyre and produced in accordance with the invention, the tyre being shown in perspective and in a half section on an equatorial plane.
Figure 2:
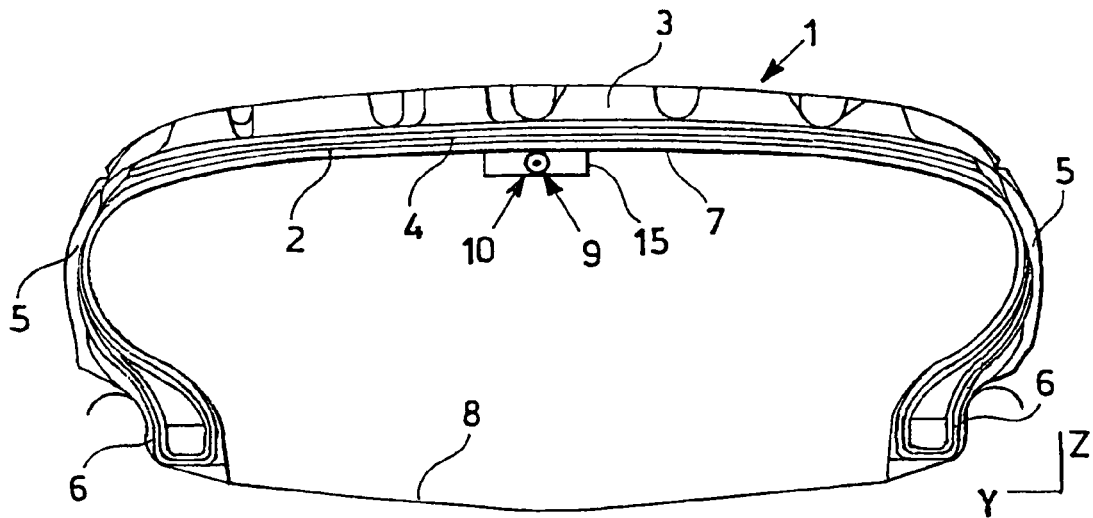
FIG. 2 is a cross section through the tyre of FIG. 1.

FIGS. 1 and 2 show a vehicle tyre 1 comprising a carcass 2, a tread 3, belt plies (belt pack) 4, sidewalls 5 and beads 6. The carcass 2 has an inside surface 7, optionally covered with a liner. The tyre 1 is mounted on a wheel rim 8. According to the invention an elongate piezoelectric element 9 formed by a coaxial piezoelectric cable 10 is associated to the tyre 1. The piezoelectric cable 10 is attached to the inside surface 7 of the carcass 2. The cable 10 extends all the way around the equatorial circumference of the inside surface of the carcass in a longitudinal direction (direction X, orthogonal to the plane YZ), that is, in the direction in which the vehicle is travelling. The piezoelectric cable 10 may also extend circumferentially along a sidewall 5 of the tyre 1 or only along a portion of the circumference (an arc of the circumference).

Figure 3:
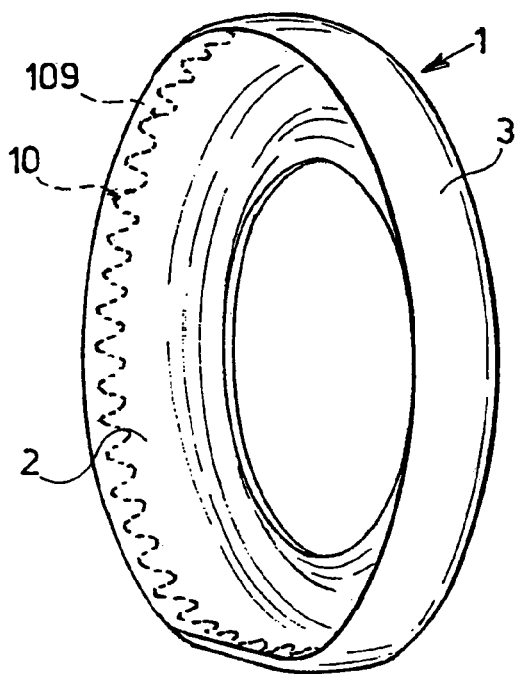
FIG. 3 shows a variant of the tyre of FIG. 1.

FIG. 3 shows an elongate piezoelectric element 109 formed by a coaxial piezoelectric cable 10 that extends along the equatorial circumference, following an undulated path.

Figure 4:
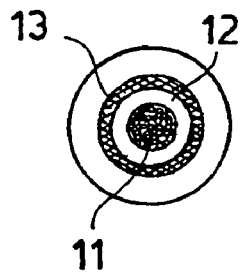
FIG. 4 is an end-on perspective view on a larger scale of the piezoelectric element of FIG. 1.
Figure 5:
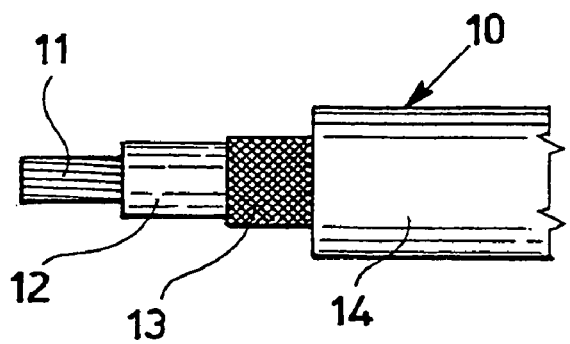
FIG. 5 is a side view of the piezoelectric element of FIG. 4.

As shown in FIGS. 4 and 5, the piezoelectric cable 10 comprises a central core 11 of electrically conducting material, an electrically insulating layer 12 and a braided conductor 13, also made of electrically conducting material. The core 11 may be made of e.g. strands of brass-coated steel wire while the conductor 13 is copper. The electrically insulating layer 12 is interposed between the core 11 and the conductor 13 and consists of a piezoelectric polymer such as polyvinylidene fluorinated (PVDF) for example. Fitted over the conductor 13 is a protective outer sheath coating 14 of elastoplastic material, e.g. polythene or halobutyl rubber. The piezoelectric cable 10 has a diameter of for example approximately 3 mm.

In the embodiments illustrated in FIGS. 1, 2 and 3, the piezoelectric cable 10 is attached to the inside surface 7 of the carcass 2, but can also be embedded within the carcass 2, where it can replace one of the cords of the carcass 2 ply, within the belt 4 where it can replace a belt cord, or in the tread 3, where it can be applied inside a circumferential groove of the tread 3, preferably in the bottom of a groove.

When the piezoelectric layer 12 is caused to deform at a certain speed, it generates a potential difference between the central core 11 and the conductor 13. This potential difference is proportional, typically in a linear way, to the variation of deformation imposed on 12. More specifically, the potential difference depends on the velocity of deformation of the piezoelectric layer 12.

This state of deformation of the piezoelectric layer 12 occurs every time a displacement of that part of the tyre to which the piezoelectric cable 10 is attached or in which it is embedded is propagated to the cable 10 and hence to the layer 12.

Figure 8:
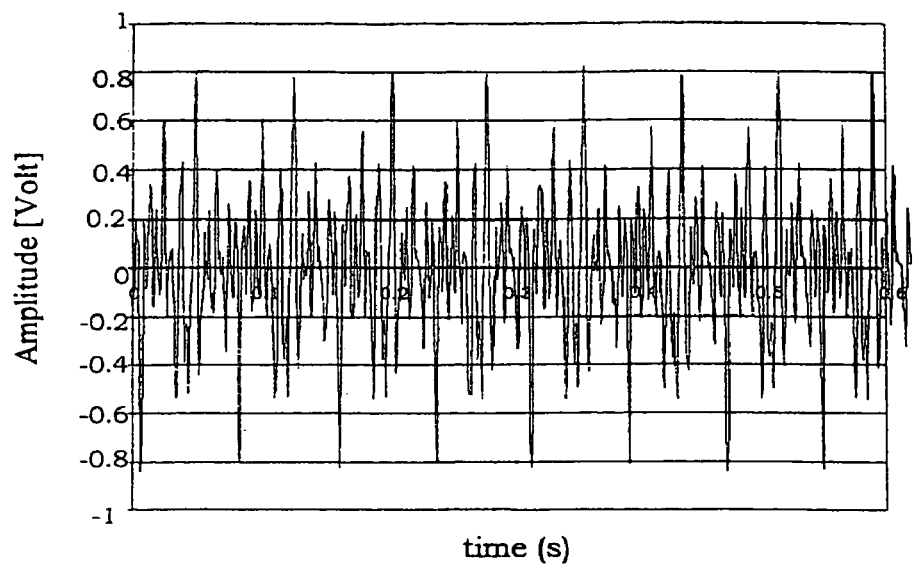
FIG. 8 is a graph showing the potential difference generated by the piezoelectric element of FIG. 1 against time.

Therefore, when the vehicle is travelling and the tyre 1 is rolling over a surface, an electric voltage (potential difference) is produced in the cable 10 proportional to the variants of its deformations. In the graph, FIG. 8, the amplitude (millivolts) of the voltage over time (sec) is shown for a piezoelectric cable 10 having an electrical capacitance equal to 700 pF/m (picofaradays per meter) and a piezoelectric coefficient d3h of 0.15 pC/N (picocoulombs per Newton), attached to a tyre rolling at a velocity of 80 km/h.

Figure 6:
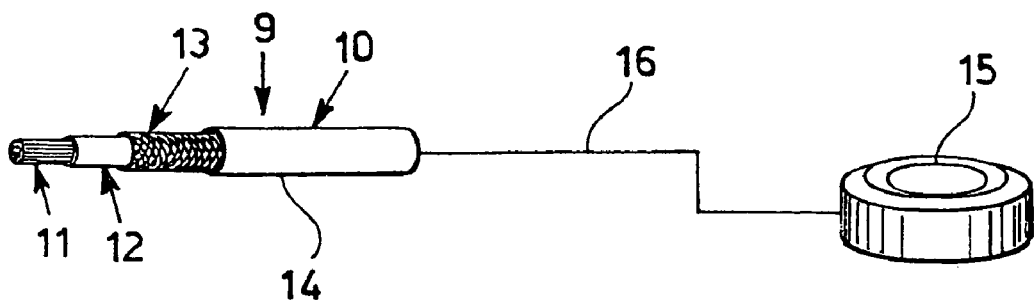
FIGS. 6 and 7 show diagrammatically a number of components of an electrical circuit applied to the tyre of FIG. 1.

The piezoelectric cable 10 is electrically connected by conductors 16 to a device 15 capable of storing the electrical energy produced (FIG. 6). The device 15 may consist of, for example, a capacitor/rechargeable battery that acts as a buffer battery and is mounted on the inside surface 7 of the carcass (FIG. 2) or inside the rim 8. In the latter case the electrical circuit is attached not only to the tyre but also therefore to the rim 8.

This provides a constant source of power because the piezoelectric cable 10 is used as a "dynamo" that generates electrical energy and the energy produced is stored in the capacitor/rechargeable battery 15.

Figure 7:
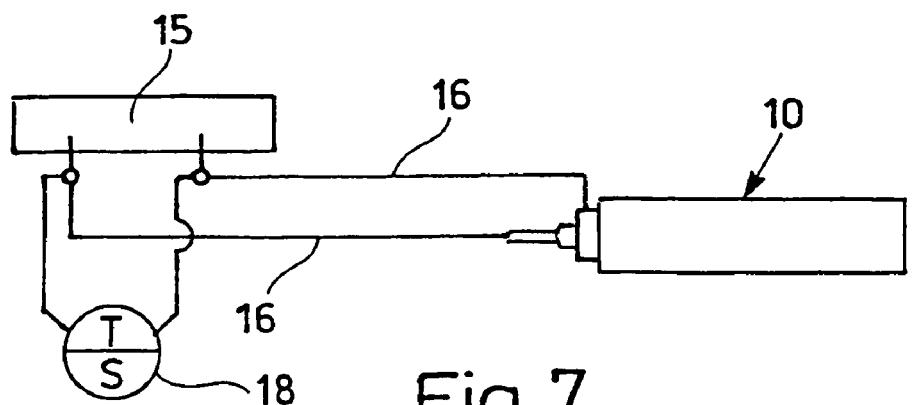

The central core 11 and the conductor 13 of the cable 10 are connected electrically not only to the capacitor/rechargeable battery 15 but also to other components of an electrical circuit. These components, which use the electrical energy generated by the cable 10, consist of sensors, transmitters or sensor/transmitters, one of which is indicated at 18 in FIG. 7.

Figure 9:
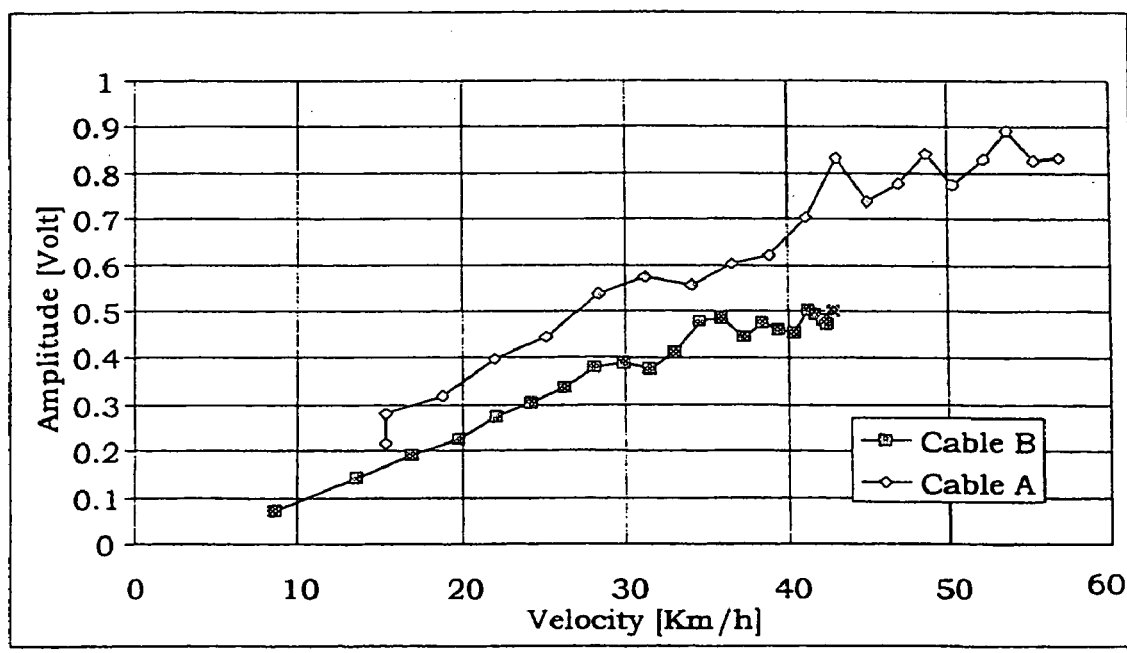
FIG. 9 is a graph showing the voltage generated by the piezoelectric element of FIG. 1 against the velocity of the vehicle.

FIG. 9 shows the amplitude of the voltage (volts) generated by two types of piezoelectric cable arranged in line along the internal equatorial circumference of a tyre as the rolling velocity (km/h) varies. In the case of curve a the piezoelectric cable had an electric capacitance of 800 pF/M and a piezoelectric coefficient d3h of 1.5 pC/N. In the case of curve b the piezoelectric cable had an electric capacitance of 700 pF/m and a piezoelectric coefficient d3h of 0.15 pC/N.

The invention claimed is:

1. A system for generating electrical energy in a tyre for a vehicle, comprising:
   at least one coaxial piezoelectric cable that generates electrical energy when deformed;
   wherein the at least one coaxial piezoelectric cable is associated with the tyre, and
   wherein the at least one coaxial piezoelectric cable extends along at least a portion of the tyre.

2. The system of claim 1, wherein the at least one coaxial piezoelectric cable is electrically connected to an electrical circuit.

3. The system of claim 2, wherein the electrical circuit is not in electrical communication with the vehicle.

4. The system of claim 3, wherein the electrical circuit comprises one or more sensors, transmitters, or sensors and transmitters for monitoring performance of the tyre, of the vehicle, or of the tyre and the vehicle.

5. The system of claim 3, wherein the electrical circuit comprises one or more sensors, transmitters, or sensors and transmitters for controlling performance of the tyre, of the vehicle, or of the tyre and the vehicle.

6. The system of claim 3, wherein the electrical circuit comprises one or more sensors, transmitters, or sensors and transmitters for monitoring and controlling performance of the tyre, of the vehicle, or of the tyre and the vehicle.

7. The system of claim 4, 5, or 6, wherein the one or more sensors comprise one or more pressure sensors, temperature sensors, force sensors, or velocity sensors.

8. The system of claim 4, 5, or 6, wherein the one or more sensors comprise any combination of two or more pressure, temperature, force, and/or velocity sensors.

9. The system of claim 4, 5, or 6, wherein the one or more transmitters transmit data from the one or more sensors out of the tyre.

10. The system of claim 9, wherein the one or more transmitters are operationally connected to a receiver associated with the vehicle.

11. The system of claim 9, wherein the one or more transmitters are radio transmitters.

12. The system of claim 3, wherein the electrical circuit comprises a device that stores electrical energy produced by the at least one coaxial piezoelectric cable.

13. The system of claim 12, wherein the device comprises one or more capacitors, one or more rechargeable batteries, or one or more capacitors and one or more rechargeable batteries.

14. The system of claim 12, wherein the device acts as a buffer battery.

15. The system of claim 3, wherein the at least one coaxial piezoelectric cable follows an undulated path along at least a portion of a circumference of the tyre.

16. The system of claim 3, wherein the at least one coaxial piezoelectric cable is embedded within a carcass of the tyre.

17. The system of claim 3, wherein the at least one coaxial piezoelectric cable replaces a cord of a carcass ply of the tyre.

18. The system of claim 3, wherein the at least one coaxial piezoelectric cable is embedded within a belt structure of the tyre.

19. The system of claim 3, wherein the at least one coaxial piezoelectric cable replaces a cord of a belt structure of the tyre.

20. The system of claim 3, wherein the at least one coaxial piezoelectric cable is embedded in a tread of the tyre.

21. The system of claim 3, wherein the at least one coaxial piezoelectric cable is disposed in a circumferential groove of the tyre.

22. The system of claim 1, wherein the at least one coaxial piezoelectric cable extends in a longitudinal direction all the way around a circumference of the tyre.

23. A tyre for a vehicle, comprising:
a carcass;
a tread; and
at least one coaxial piezoelectric cable;
wherein the at least one coaxial piezoelectric cable generates electrical energy when deformed, and
wherein the at least one coaxial piezoelectric cable extends along at least a portion of the tyre.

24. The tyre of claim 23, wherein the at least one coaxial piezoelectric cable is electrically connected to an electrical circuit.

25. The tyre of claim 24, wherein the electrical circuit is not in electrical communication with the vehicle.

26. The tyre of claim 25, wherein the electrical circuit comprises one or more sensors, transmitters, or sensors and transmitters for monitoring performance of the tyre, of the vehicle, or of the tyre and the vehicle.

27. The tyre of claim 25, wherein the electrical circuit comprises one or more sensors, transmitters, or sensors and transmitters for controlling performance of the tyre, of the vehicle, or of the tyre and the vehicle.

28. The tyre of claim 25, wherein the electrical circuit comprises one or more sensors, transmitters, or sensors and transmitters for monitoring and controlling performance of the tyre, of the vehicle, or of the tyre and the vehicle.

29. The tyre of claim 26, 27, or 28, wherein the one or more sensors comprise one or more pressure sensors, temperature sensors, force sensors, or velocity sensors.

30. The tyre of claim 26, 27, or 28, wherein the one or more sensors comprise any combination of two or more pressure, temperature, force, and/or velocity sensors.

31. The tyre of claim 26, 27, or 28, wherein the one or more transmitters transmit data from the one or more sensors out of the tyre.

32. The tyre of claim 31, wherein the one or more transmitters are operationally connected to a receiver associated with the vehicle.

33. The tyre of claim 31, wherein the one or more transmitters are radio transmitters.

34. The tyre of claim 25, wherein the electrical circuit comprises a device that stores electrical energy produced by the at least one coaxial piezoelectric cable.

35. The tyre of claim 34, wherein the device comprises one or more capacitors, one or more rechargeable batteries, or one or more capacitors and one or more rechargeable batteries.

36. The tyre of claim 34, wherein the device acts as a buffer battery.

37. The tyre of claim 25, wherein the at least one coaxial piezoelectric cable follows an undulated path along at least a portion of a circumference of the tyre.

38. The tyre of claim 25, wherein the at least one coaxial piezoelectric cable is embedded within a carcass of the tyre.

39. The tyre of claim 25, wherein the at least one coaxial piezoelectric cable replaces a cord of a carcass ply of the tyre.

40. The tyre of claim 25, wherein the at least one coaxial piezoelectric cable is embedded within a belt structure of the tyre.

41. The tyre of claim 25, wherein the at least one coaxial piezoelectric cable replaces a cord of a belt structure of the tyre.

42. The tyre of claim 25, wherein the at least one coaxial piezoelectric cable is embedded in a tread of the tyre.

43. The tyre of claim 25, wherein the at least one coaxial piezoelectric cable is disposed in a circumferential groove of the tyre.

44. The tyre of claim 23, wherein the at least one coaxial piezoelectric cable extends in a longitudinal direction all the way around a circumference of the tyre.

* * * * *